United States Patent
Saito

(10) Patent No.: US 9,196,599 B2
(45) Date of Patent: Nov. 24, 2015

(54) CONNECTION DEVICE, METHOD FOR MANUFACTURING CONNECTION STRUCTURE, METHOD FOR MANUFACTURING STACKED CHIP COMPONENT AND METHOD FOR MOUNTING ELECTRONIC COMPONENT

(71) Applicant: Dexerials Corporation, Tokyo (JP)

(72) Inventor: Takayuki Saito, Tochigi (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 14/355,852

(22) PCT Filed: Oct. 31, 2012

(86) PCT No.: PCT/JP2012/078237
§ 371 (c)(1),
(2) Date: May 2, 2014

(87) PCT Pub. No.: WO2013/069522
PCT Pub. Date: May 16, 2013

(65) Prior Publication Data
US 2014/0302643 A1    Oct. 9, 2014

(30) Foreign Application Priority Data
Nov. 7, 2011    (JP) .................... 2011-243528

(51) Int. Cl.
*H01L 21/44*      (2006.01)
*H01L 23/00*      (2006.01)
(Continued)

(52) U.S. Cl.
CPC ............ *H01L 24/742* (2013.01); *H01L 21/563* (2013.01); *H01L 24/29* (2013.01); *H01L 24/75* (2013.01); *H01L 24/81* (2013.01); *H01L 24/83* (2013.01); *H01L 25/50* (2013.01); *H01L 24/13* (2013.01); *H01L 24/16* (2013.01); *H01L 24/27* (2013.01); *H01L 24/32* (2013.01); *H01L 24/97* (2013.01); *H01L 2224/16145* (2013.01); *H01L 2224/16225* (2013.01);
(Continued)

(58) Field of Classification Search
None
See application file for complete search history.

(56) References Cited

U.S. PATENT DOCUMENTS

| 4,903,885 A | 2/1990 | Schwarzbauer |
| 2008/0035274 A1* | 2/2008 | Kanisawa ............ 156/583.1 |

(Continued)

FOREIGN PATENT DOCUMENTS

| EP | 1845556 A1 | 10/2007 |
| JP | 1-255231 A | 10/1989 |

(Continued)

OTHER PUBLICATIONS

International Search Report issued in PCT/JP2012/078237 mailed on Jan. 15, 2013 (3 pages).
(Continued)

*Primary Examiner* — Kyoung Lee
(74) *Attorney, Agent, or Firm* — Osha Liang LLP

(57) ABSTRACT

A connection device includes a mounting section on which an electronic component stacked with a thermosetting adhesive agent layer is mounted, a heat press head for heating and pressing the electronic component, a first elastic body that is disposed between the electronic component and a pressing surface of the heat press head so as to press an upper surface of the electronic component, and a support member that is disposed on a periphery of the electronic component and supports the first elastic body.

6 Claims, 6 Drawing Sheets

(51) Int. Cl.
*H01L 25/00* (2006.01)
*H01L 21/56* (2006.01)

(52) U.S. Cl.
CPC ............... *H01L 2224/16238* (2013.01); *H01L 2224/27003* (2013.01); *H01L 2224/27334* (2013.01); *H01L 2224/2919* (2013.01); *H01L 2224/2929* (2013.01); *H01L 2224/2936* (2013.01); *H01L 2224/2939* (2013.01); *H01L 2224/2946* (2013.01); *H01L 2224/2949* (2013.01); *H01L 2224/29311* (2013.01); *H01L 2224/29316* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29371* (2013.01); *H01L 2224/29386* (2013.01); *H01L 2224/29388* (2013.01); *H01L 2224/29411* (2013.01); *H01L 2224/29416* (2013.01); *H01L 2224/29424* (2013.01); *H01L 2224/29439* (2013.01); *H01L 2224/29444* (2013.01); *H01L 2224/29447* (2013.01); *H01L 2224/29455* (2013.01); *H01L 2224/29457* (2013.01); *H01L 2224/29471* (2013.01); *H01L 2224/29486* (2013.01); *H01L 2224/32145* (2013.01); *H01L 2224/32225* (2013.01); *H01L 2224/73104* (2013.01); *H01L 2224/73204* (2013.01); *H01L 2224/7598* (2013.01); *H01L 2224/75252* (2013.01); *H01L 2224/75301* (2013.01); *H01L 2224/75315* (2013.01); *H01L 2224/81* (2013.01); *H01L 2224/81193* (2013.01); *H01L 2224/81203* (2013.01); *H01L 2224/81903* (2013.01); *H01L 2224/8385* (2013.01); *H01L 2224/83101* (2013.01); *H01L 2224/83192* (2013.01); *H01L 2224/83203* (2013.01); *H01L 2224/83851* (2013.01); *H01L 2224/83862* (2013.01); *H01L 2224/97* (2013.01); *H01L 2225/06513* (2013.01); *H01L 2225/06541* (2013.01); *H01L 2225/06565* (2013.01); *H01L 2924/01029* (2013.01); *H01L 2924/07802* (2013.01); *H01L 2924/07811* (2013.01); *H01L 2924/3512* (2013.01)

(56) References Cited

U.S. PATENT DOCUMENTS

2008/0050904 A1    2/2008  Lake
2009/0291524 A1    11/2009 Takahashi

FOREIGN PATENT DOCUMENTS

| JP | 2007-227622 A | 9/2007 |
| JP | 2008/205068 A | 9/2008 |
| JP | 2009/016544 A | 1/2009 |
| JP | 2010-166097 A | 7/2010 |
| JP | 2011-501394 A | 1/2011 |

OTHER PUBLICATIONS

Partial Supplementary European Search Report issued in corresponding European Application No. 12847519.1 dated Jul. 3, 2015 (10 pages).

"Hardness", Oct. 5, 2011, XP055194929, Retrieved from the internet: URL:http://web.archive.org/web/20111005211858/http://oringsusa.com/html/durometer_of o-rings.html [retrieved on Jun. 6, 2015] *the whole document* (1 page).

"Asker JIS Type JA Durometers: Specifications. Asker JIS Type JC Durometers: Specifications. Asker JIS K6253 Types: Descriptions of Models". (Aug. 7, 2008), XP055194933, Retrieved from the internet: URL:http://web.archive.org/web/20080807173123/http://www.ccsi-inc.com/p-durometer-asker-jis.htm [retrieved on Jun. 10, 2015] *part "Asker JIS Type JA Durometers: Specifications"* (1 page).

\* cited by examiner

CONNECTION DEVICE, METHOD FOR MANUFACTURING CONNECTION STRUCTURE, METHOD FOR MANUFACTURING STACKED CHIP COMPONENT AND METHOD FOR MOUNTING ELECTRONIC COMPONENT

CROSS-REFERENCE TO RELATED APPLICATIONS

This application is a National Stage application of International Patent Application No. PCT/JP2012/078237, filed on Oct. 31, 2012, which claims priority pursuant to 35 U.S.C. §119(a) to Japanese Patent Application No. 2011-243528, filed on Nov. 7, 2011. The international application and priority application are hereby incorporated by reference in their entirety.

BACKGROUND OF INVENTION

1. Field of the Invention

One or more embodiments of the present invention relates to a connection device, a method for manufacturing a connection structure and an electronic component, and an assembling method thereof and in particular concerns a connection device for assembling an electronic component disposed on a substrate assembling section with an adhesive agent interposed therebetween by heating and pressing electronic component with a buffer member interposed therebetween, a method for manufacturing a connection structure and an electronic component, and an assembling method thereof.

2. Background Art

Conventionally, as a technique for assembling an electronic component such as a semiconductor chip on a substrate, a technique has been known in which the electronic component is mounted on a substrate with an anisotropic conductive film (ACF) interposed therebetween and the electronic component is heated and pressed by using a heat press head. As an assembling device 100 for use in this technique, as shown in FIG. 7, a device, which is provided with a mounting section 102 on which a substrate 101 is mounted and a heat press head 105 for heating and pressing an electronic component 104 mounted on the substrate 101 with an anisotropic conductive film 103 interposed therebetween, has been proposed.

This heat press head 105 having a built-in heater is designed to be freely raised and lowered relative to the mounting section 102 by a lifting/lowering mechanism, as not shown. Moreover, on the assembling device 100, when the electronic component 104 is mounted on the substrate with the anisotropic conductive film 103 interposed therebetween, the heat press head 105 is pressed onto an upper surface of the electronic component so that a heat pressing process is carried out for a predetermined period of time at a predetermined temperature and a predetermined pressure. Thus, the assembling device 100 connects the electronic component 104 onto the substrate 101 electrically and mechanically.

Moreover, as the assembling device, as shown in FIGS. 8A-8B, another device is proposed in which a buffer member 106 is interposed between the heat press head 105 and the electronic component 104. By interposing the buffer member 106 therebetween, the assembling device 100 prevents a pressure from concentrating on the electrode 104a of the electronic component 104, thereby making it possible to prevent warping and cracking of the electronic component 104 or the substrate 101. The buffer member 106 is formed by using an elastic body such as silicone rubber. Moreover, as the buffer member 106, as shown in FIG. 8A, a buffer member 106a having a plate shape, which presses the entire upper surface of the substrate 101 on which the electronic component 104 is mounted, or a buffer member 106b in which, as shown in FIG. 8B, concave sections 108 corresponding to the shape of the electronic component 107 having been preliminarily assembled thereon are formed so that the pressure concentration onto the electronic component 107 is effectively dispersed, have been known.

RELATED ART

Patent Document

PTL 1: Japanese Patent Application Laid-Open No. 2007-227622

However, because the buffer member 106 used in the conventional assembling device allows a stress to be concentrated on the outer peripheral portion of the substrate 101 or the electronic component 104, cracking or the like sometimes tends to occur in the electronic component 104.

Moreover, in recent years, as an electronic component, a chip stacked component 108 configured by stacking chip substrates having a thickness of about 100 μm, as shown in FIG. 9 has been used. This chip stacked component 108 is formed by processes in which small holes are opened on chip substrates 109 and by filling the holes with metal such as Cu, and by electrically connecting a plurality of the chip substrates stacked into a sandwich state.

In the case when this chip stacked component 108 is assembled, because metal bumps 110 protrude onto the surface of the chip substrate, the pressing force by the heat press head 105 tends to be concentrated on the metal bumps 110, with the result that cracking may occur in the chip substrates 109 by the pressure concentration. In particular, in the case when ultra-thin chip substrates 109 having a thickness of 50 μm or less are used, such a risk is increased.

Moreover, even in the case when the buffer member 106a shown in FIG. 8A is interposed or a buffer member 111 composed of elastic bodies supporting the upper surface and side faces of the chip stacked component 108, shown in FIG. 9, is interposed, so as to avoid this cracking of the chip substrates 109, a stress S of the buffer member 111 that has received the pressing force of the heat press head 105 is concentrated on the outer peripheral portion of the chip stacked component 108, with the result that cracking may occur. When the cracking occurs in the chip substrates 109, the reliability of the interlayer connection of the respective chip substrates 109 is impaired.

Moreover, even in the case when a technique for manufacturing the chip stacked component 108 by stacking the chip substrates 109 with a thermosetting adhesive agent being interposed therebetween and by heating and pressing them in a batch process from above by a heat press head 7 is adopted, the pressing force by the heat press head 105 tends to be concentrated on the metal bumps 110, with the result that cracking may occur in the chip substrates 109 due to the pressure concentration, and the pressing force of the heat press head 105 is concentrated on the outer peripheral portion of the chip stacked component 108 through the buffer member 111, with the result that cracking may occur.

In the case when cracking occurs in the chip stacked component 108, the reliability of the interlayer connection of the chip substrates 109 is subsequently impaired.

SUMMARY OF INVENTION

Therefore, one or more embodiments of the present invention provides a connection device capable of preventing cracking in an electronic component, a method for manufacturing a connection structure, a method for manufacturing a chip stacked component, and an assembling method of the electronic component.

The connection device according to one or more embodiments of the present invention may comprise: a mounting section on which an electronic component stacked with a thermosetting adhesive agent layer is mounted; a heat press head for heating and pressing the electronic component; a first elastic body that is disposed between the electronic component and the pressing surface of the heat press head so as to press an upper surface of the electronic component; and a support member that is disposed on the periphery of the electronic component and supports the first elastic body.

Moreover, the method for manufacturing the connection structure according to one or more embodiments of the present invention may comprise: mounting a substrate on which an electronic component is assembled on a mounting section; installing the electronic component on the substrate mounted on the mounting section with a thermosetting adhesive agent interposed therebetween; and disposing a first elastic body on an upper surface side of the electronic component, as well as disposing a support member for supporting the first elastic body on the periphery of the electronic component, and heating and pressing the electronic component by a heat press head with the first elastic body interposed therebetween so as to be assembled on the substrate.

Furthermore, the method for manufacturing the chip stacked component according to one or more embodiments of the present invention, which is a manufacturing method for the chip stacked component in which a plurality of chip substrates are stacked, with the respective chip substrates being connected to one another electrically and mechanically, may comprise: mounting bumps formed on one surface of each chip substrate on an electrode formed on the other surface of an adjacent chip substrate with a thermosetting adhesive agent interposed therebetween so that a chip stacked body on which a plurality of chip substrates are stacked is formed; and disposing a first elastic body on an upper surface side of the chip stacked body, as well as disposing a support member for supporting the first elastic body on the periphery of the chip stacked component, and heating and pressing the chip stacked component by using a heat press head with the first elastic body being interposed therebetween.

Furthermore, the method for assembling an electronic component according to one or more embodiments of the present invention may comprise: mounting a substrate on which an electronic component is assembled on a mounting section; installing the electronic component on the substrate mounted on the mounting section with a thermosetting adhesive agent interposed therebetween; and disposing a first elastic body on an upper surface side of the electronic component, as well as disposing a support member for supporting the first elastic body on the periphery of the electronic component, and heating and pressing the electronic component by a heat press head with the first elastic body interposed therebetween.

In accordance with one or more embodiments of the present invention, because a first elastic body is disposed between the electronic component and the pressing surface of the heat press head so as to press the upper surface of the electronic component and because the support member is also disposed on the periphery of the electronic component so as to support the first elastic body, the upper surface of the electronic component can be uniformly heated and pressed with or without the bumps, and the pressure by the first elastic body can be prevented from being concentrated onto the outer periphery of the electronic component. Therefore, one or more embodiments of the present invention make it possible to prevent cracking of the electronic component.

DETAILED DESCRIPTION

Figure 1:
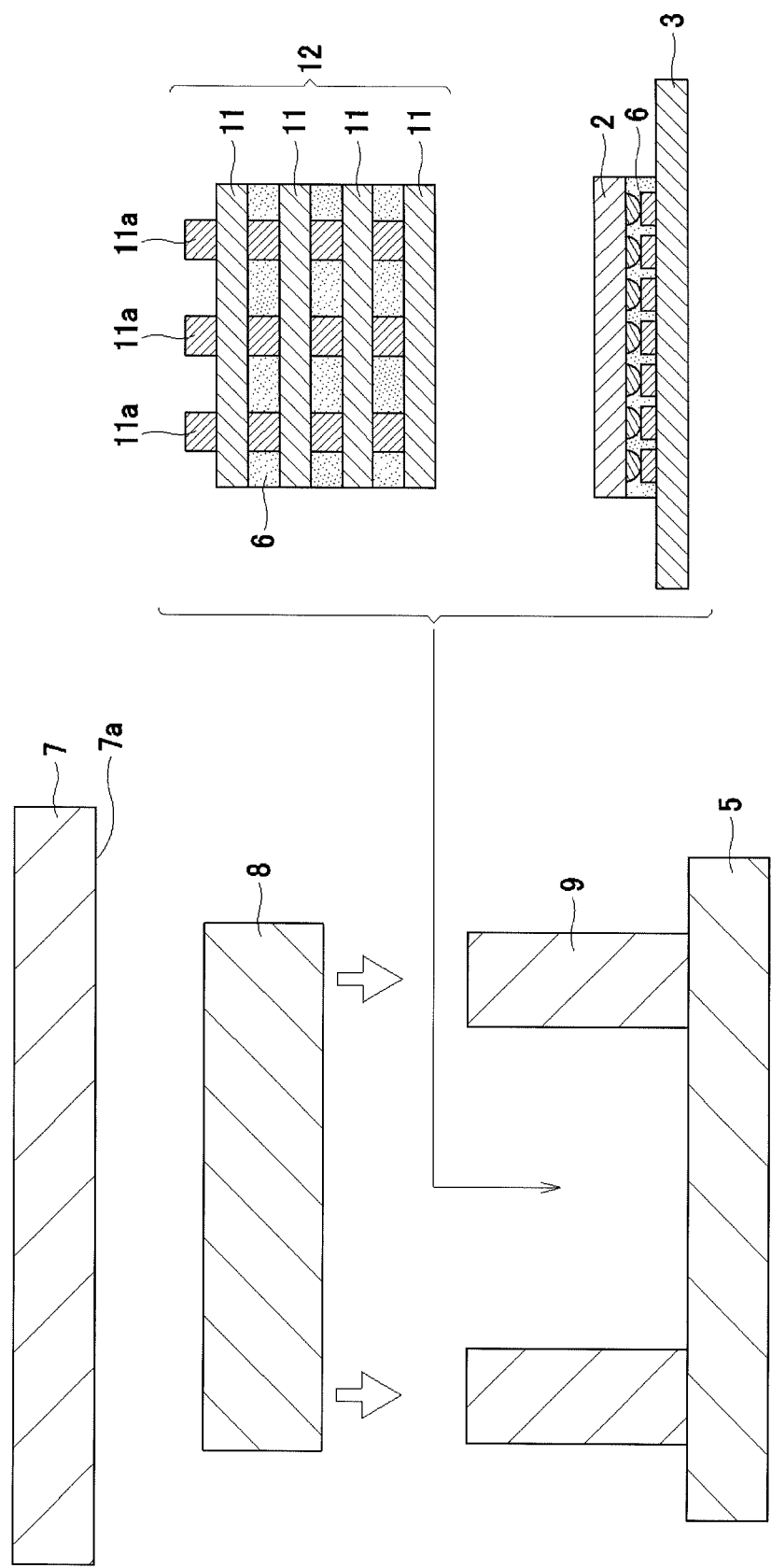
FIG. 1 is a cross-sectional view showing a connection device according to one or more embodiments of the present invention.

In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention. Referring to Figures, the following description will discuss the connection device to which one or more embodiments of the present invention is applied, the manufacturing method of a connection structure, a method for manufacturing a chip stacked component, and the assembling method of an electronic component in detail. Additionally, one or more embodiments of the present invention is not intended to be limited by the following embodiments, and it is needless to say that various modifications may be made therein without departing from the scope of the present invention. Moreover, Figures are schematic drawings, and the ratios or the like of the respective dimensions are sometimes different from those of actual values. Specific dimensions or the like should be determined by taking into consideration the following explanations. It is needless to say that among the Figures, portions having different relationships in dimensions and ratios are included in mutual Figures.

[Connection Device]

A connection device 1 to which one or more embodiments of the present invention is applied is used for manufacturing a connection structure 4 in which surface assembling components 2 are assembled on a wiring substrate 3 or a chip stacked component 10 in which respective chip substrates 11 of a chip stacked body 12 formed by stacking the chip substrates 11 with an adhesive agent interposed therebetween are connected to one another electrically and mechanically. As the surface assembling components 2, for example, package components, such as ICs and LSIs; chip components, such as resistors, capacitors; and chip stacked components 10 using a TSV (Through Silicon Via) technique in which chip substrates 11, such as semiconductor chips or the like, are three-dimensionally disposed and by filling small holes are opened on the semiconductor chips with metal, a plurality of chip substrates stacked in a sandwich state are electrically connected, are proposed. In the present application, both of the surface assembling components 2 and the chip stacked body 12 to be mounted on a substrate 3 are referred to as electronic components.

As shown in FIG. 1, this connection device 1 is provided with: a mounting section 5 on which a wiring substrate 3 on which a surface assembling component 2 is assembled and a chip stacked body 12 are mounted; a heat press head 7 for heating and pressing the surface assembling component 2 and the chip stacked body 12 mounted on the wiring substrate 3 with a thermosetting adhesive agent 6 interposed therebetween; a first elastic body 8 that is disposed between the surface assembling component 2 as well as the chip stacked body 12 and the pressing surface of the heat press head 7 so as to press the upper surface of the surface assembling component 2 and the chip stacked body 12; and a second elastic body 9 that is disposed on the periphery of the surface assembling component 2 and the chip stacked body 12, and supports the first elastic body 8.

The mounting section 5 is made of, for example, a plate-shaped ceramic member, with the wiring substrate 3 and the chip stacked body 12 mounted on the upper surface thereof.

The heat press head 7 thermally cures the adhesive agent 6 by heating and pressing the surface assembling component 2 and the chip stacked body 12 so that the surface assembling component 2 and the electrodes of the wiring substrate 3 are connected to one another electrically and mechanically or the respective chip substrates 11 of the chip stacked body 12 are connected to one another electrically and mechanically. The heat press head 7, which has a built-in heater, is supported by a raising/lowering mechanism, not shown, so that its heat pressing surface 7a is freely made closer to, or farther from the mounting section 5; thus, it becomes possible to heat and press the surface assembling component 2 placed on the wiring substrate 3 mounted on the mounting section 5 with the adhesive agent 6 interposed therebetween and the chip stacked body 12 mounted on the mounting section 5 for a predetermined period of time at a predetermined temperature and a predetermined pressure.

[First Elastic Body 8]

The first elastic body 8 is interposed between the heat pressing surface of the heat press head 7 and the upper surfaces of the surface assembling component 2 and the chip stacked body 12 so that a pressure difference between the center portion and the outer peripheral portion of the surface assembling component 2 and the chip stacked body 12 or a pressure difference between a region where bumps are formed and a region where no bumps are formed is absorbed, thereby making it possible to carry out uniform heating and pressing processes on the surface assembling component 2 and the chip stacked body 12.

The first elastic body 8 is made of, for example, an elastic member such as a silicone resin, and is formed almost into a rectangular plate-shape as a whole. Moreover, the first elastic body 8 has an area capable of covering the upper surface of the surface assembling component 2 or the chip stacked body 12, and has the outer peripheral portion supported by the second elastic body 9 disposed on the periphery of the surface assembling component 2 or the chip stacked body 12.

[Second Elastic Body 9]

The second elastic body 9 is disposed on the periphery of the surface assembling component 2 and the chip stacked body 12, and serves as a support member for supporting the first elastic body 8 so that the pressure of the first elastic body 8 heated and pressed by the heat press head 7 is prevented from being concentrated on the outer peripheral portion of the surface assembling component 2 and the chip stacked body 12.

The second elastic body 9, which is made of an elastic member such as, for example, a silicone resin, is formed into a hollow shape as a whole, with upper and lower ends being opened, and disposed in a manner so as to surround the periphery of the surface assembling component 2 and the chip stacked body 12. Moreover, the second elastic body 9 is formed so as to have virtually the same height as that of the surface assembling component 2 and the chip stacked body 12, and with this structure, the outer peripheral portion of the first elastic body 8 that presses the surface assembling component 2 and the chip stacked body 12 is supported. By using the second elastic body 9 capable of expanding and contracting upward and downward as the support member, an error of the second elastic body 9 in the height direction can be absorbed so that it becomes not necessary for the connection device 1 to control its height with high precision so as to be coincident with that of the surface assembling component 2 and the chip stacked body 12. Additionally, in the case when the height of the connection device 1 allows to be formed with high precision in accordance with that of the surface assembling component 2 and the chip stacked body 12, it is not necessarily to form the support member by using the elastic body.

In this manner, because the connection device 1 is provided with the first elastic body 8 that is disposed between the electronic component, such as the surface assembling component 2 and the chip stacked body 12, and the heat pressing surface 7a of the heat press head 7 so as to press the upper surface of the electronic component and the second elastic body 9 that is disposed on the periphery of the electronic component and serves as the support member for supporting the first elastic body 8, the upper surface of the electronic component 2 and the chip laminated body 12 can be uniformly heated and pressed with or without the bumps, and the pressure by the first elastic body 8 can be prevented from being concentrated onto the periphery of the electronic component.

In particular, in the case of assembling the chip stacked component 10 as the electronic component, because bumps 11a are formed on the chip substrates 11 in a manner so as to protrude thereon, the pressing force by the heat press head 7 tends to be concentrated on the bumps 11a, with the result that cracking may occur in the chip substrates 11 by the pressure concentration. Moreover, because thin chip substrates 11 are stacked, cracking tends to easily occur in the chip substrates 11 when a pressure is concentrated on the outer peripheral portion thereof.

However, in the connection device 1, by carrying out heating and pressing processes with the first elastic body 8 interposed therebetween, the pressure to be concentrated onto the bumps 11a can be dispersed, and by supporting the first elastic body 8 with the second elastic body 9, it becomes possible to prevent the pressure concentration onto the outer peripheral portion of the chip stacked component 10 due to the first elastic body 8, and consequently to prevent cracking of the chip substrates 11 and the connection reliability between the respective chip substrates 11 can be improved.

[Hardness]

In the connection device 1, the hardness of the second elastic body 9 may be made higher than the hardness of the first elastic body 8. With this arrangement, the first elastic body 8 can be positively supported by the second elastic body 9 so that the pressure concentration onto the outer peripheral portion of the chip stacked body 12 due to the first elastic body 8 can be effectively prevented. On the other hand, in the case when the hardness of the second elastic body 9 is less than the hardness of the first elastic body 8, because the second elastic body 9 is pressed by the first elastic body 8, it is not possible to prevent the pressure concentration onto the outer peripheral portion of the surface assembling component 2 and the chip stacked body 12 due to the first elastic body 8.

Moreover, the hardness of the first elastic body 8 and the second elastic body 9 may be set in a range from 20 to 60 when measured by a type-A durometer specified by JIS K 6253. When the hardness of the first elastic body 8 and the second elastic body 9 is smaller than 20, the pressure by the heat press head 7 cannot be absorbed, and the first elastic body 8 cannot be supported by the second elastic body 9. Moreover, in the case when the hardness of the first elastic body 8 and the second elastic body 9 is greater than 60, the first elastic body 8 is not distorted even when it comes into contact with the upper surface of the chip stacked component 10, thereby failing to disperse the pressure of the chip substrate 11 to be concentrated on the bumps 11a.

[Adhesive Agent]

Figure 2:
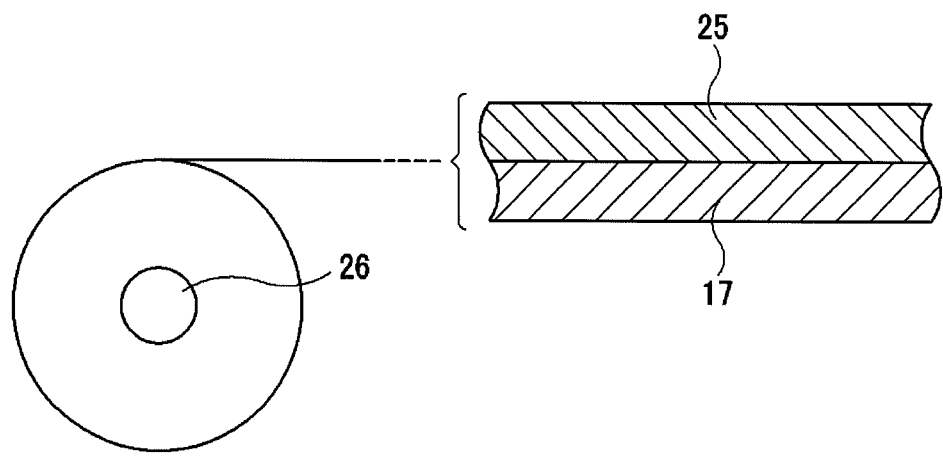
FIG. 2 is a cross-sectional view showing an insulating adhesive film according to one or more embodiments.

The following description will discuss an adhesive agent 6 that is heated and pressed by the heat press heard 7, so that the surface assembling component 2 is connected onto the wiring substrate 3 or the chip substrates 11 are mutually connected to each other. For example, as shown in FIG. 2, the adhesive agent 6 is made of a normal binder (adhesive agent) 23 containing a film-forming resin, a thermosetting resin, a potential curing agent, a silane coupling agent or the like, and is formed into a film-shape or a paste-shape. The following explanation will be given by exemplifying an insulating adhesive film 17 (NCF [Non Conductive Film]) molded into a film-shape.

This insulating adhesive film 17 is heated and pressed by the heat press head 7, so that the binder 23 is cured with the connection electrode of the wiring substrate 3 and the electrode of the surface assembling component 2 being made in contact with each other; thus, the two electrodes are connected to one another electrically and mechanically. Alternatively, the insulating adhesive film 17 is interposed between a plurality of chip substrates 11 forming the chip stacked body 12, and heated and pressed by the heat press head 7, so that it is cured with the interlayer between the chip substrates 11 being connected by the bumps 11a; thus, the plural chip substrates 11 are consequently connected to one another electrically and mechanically.

As shown in FIG. 2, the insulating adhesive film 17 is formed on a separation film 25 by applying a thermosetting adhesive composition made of the binder 23 onto the separation film 25. The separation film 25 is formed by applying a separation agent such as silicone onto, for example, PET (Poly Ethylene Terephthalate), OPP (Oriented Polypropylene), PMP (Poly-4-methylpentene-1), PTFE (Polytetrafluoroethylene) or the like, so that it becomes possible to maintain the shape of the insulating adhesive film 17.

As the film-forming resin contained in the binder 23, a resin having an average molecular weight in a range from about 10000 to 80000 may be used. Examples of the film-forming resin include various resins, such as an epoxy resin, a modified epoxy resin, a urethane resin, a phenoxy resin. Among these, from the viewpoints of a film-forming state, connection reliability or the like, the phenoxy resin may be used.

As the thermosetting resin, not particularly limited, for example, commercially available epoxy resins, acrylic resins or the like are included.

Although not particularly limited, examples of the epoxy resin include: a naphthalene-type epoxy resin, a biphenyl-type epoxy resin, a phenol novolac-type epoxy resin, a bisphenol-type epoxy resin, a stilbene-type epoxy resin, a triphenol methane-type epoxy resin, a phenol aralkyl-type epoxy resin, a naphthol-type epoxy resin, a dicyclopentadiene-type epoxy resin, a triphenyl methane-type epoxy resin or the like. One of these may be used alone, or two or more kinds of these may be used in combination.

As the acrylic resin, not particularly limited, selection of appropriate acrylic compounds, liquid-state acrylates or the like is made on demand in accordance with its purpose. Examples thereof include: methyl acrylate, ethyl acrylate, isopropyl acrylate, isobutyl acrylate, epoxy acrylate, ethylene glycol diacrylate, diethylene glycol diacrylate, trimethylolpropane triacrylate, dimethylol tricyclodecane diacrylate, tetramethylene glycol tetraacrylate, 2-hydroxy-1,3-diacryloxy propane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl) isocyanurate, urethane acrylate, epoxy acrylate or the like. Additionally, those acrylates formed into methacrylates may also be used. One of these may be used alone, or two or more kinds of these may be used in combination.

As the potential curing agent, although not particularly limited, various curing agents, such as, for example, heat curing-type, UV-ray curing-type resins, may be included. The potential curing agent is not reacted normally, but is activated by various kinds of triggers, such as heat, light, pressure application that is selected depending on its purpose, and allowed to start a reaction. The activation method for the thermal activation-type potential curing agent includes a method for generating an active factor (cations, anions, radicals) by a dissociation reaction or the like resulting from a heating process, a method in which the active factor is dispersed stably in the epoxy resin at about the normal temperature, and is compatibly dissolved with an epoxy resin at a high temperature to start a curing reaction, a method in which a curing agent of a molecule sieve sealed-type is eluted at a high temperature so as to start a curing reaction, a method of elution and curing by the use of micro-capsules or the like. Examples of the thermal activation-type potential curing agent include imidazoles, hydrazides, boron trifluoride-amine complexes, sulfonium salts, amine imides, polyamine salts, dicyandiamides or the like, and modified compounds thereof, and one of these may be used alone, or two or more kinds of these may be used as mixed compounds. Among these, micro-capsule-type imidazole-based potential curing agents may be used.

As the silane coupling agent, although not particularly limited, epoxy-based, amino-based, mercapto-sulfide-based, ureido-based agents or the like are included. By adding a silane coupling agent thereto, the adhesive property on the interface between an organic material and an inorganic material can be improved.

Figure 3:
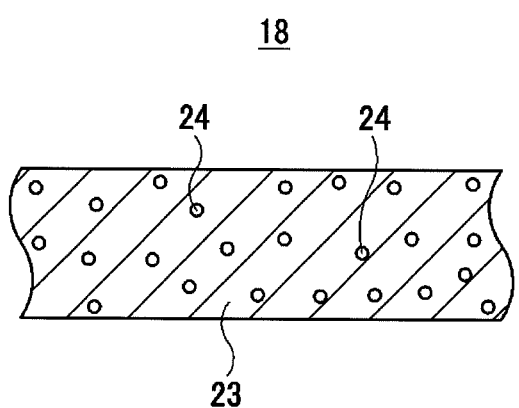
FIG. 3 is a cross-sectional view showing an anisotropic conductive film according to one or more embodiments.

Additionally, in the process for assembling the surface assembling component 2 on the wiring substrate 3, in place of the insulating adhesive film 17, an anisotropic conductive film (ACF) 18 formed by dispersing conductive particles 24 in a binder 23, as shown in FIG. 3, may be used. In this case, the conductive particles 24 are sandwiched between the respective electrodes of the surface assembling component 2 and the wiring substrate 3, and the binder 23 is thermally cured in this state, so that both of the electrodes are connected to one another electrically and mechanically.

As the conductive particles 24, any of publicly known conductive particles used for the anisotropic conductive film 18 may be included. Examples of the conductive particles 24 include particles of various metals and metal alloys, such as nickel, iron, copper, aluminum, tin, lead, chromium, cobalt, silver, gold, metal oxides, those particles formed by coating the surface of particles of carbon, graphite, glass ceramics, plastics or the like with metal, or those particles formed by further coating the surface of these particles with an insulating thin film. In the case of using those resin particles having the surface coated with metal, examples of the resin particles include epoxy resin, phenolic resin, acrylic resin, acrylonitrile-styrene (AS) resin, benzoguanamine resin, divinyl benzene-based resin, and styrene-based resin particles or the like.

Additionally, from the viewpoints of easiness in handling, storage stability or the like, the insulating adhesive film 17 and the anisotropic conductive film 18 may have a configuration in which a separation film is also stacked on a surface opposite to the surface with the separation film 25 formed thereon. Moreover, although not particularly limited, the shape of the insulating adhesive film 17 and the anisotropic conductive film 18 may be formed into an elongated tape-shape capable of being wound around a take-up reel 26, for example, as shown in FIG. 2, and may be used by cutting it into a predetermined length.

Moreover, in the above-mentioned embodiments, explanations have been given by exemplifying an adhesive film formed by molding a thermosetting resin composition appropriately containing conductive particles 24 in a binder 23 into a film shape as the adhesive agent; however, not limited by this, the adhesive agent relating to one or more embodiments of the present invention may have a configuration in which, for example, respectively two or more layers of insulating adhesive agent layers composed of only the binder 23 and conductive particles-containing layers composed of the binder 23 containing conductive particles 24 are formed. Moreover, not limited to such an adhesive film molded into a film-shape, the adhesive agent may be prepared as an insulating adhesive paste composed of only the insulating adhesive agent composition or as a conductive adhesive paste formed by dispersing conductive particles into the insulating adhesive agent composition. The adhesive agent relating to one or more embodiments of the present invention may include any of the above-mentioned modes.

[Production Process 1]

The following description will discuss a process for producing a connection structure 4 in which the surface assembling component 2 is connected to the wiring substrate 3 by using the connection device 1. In one or more embodiments, explanations will be given by exemplifying a configuration in which the chip stacked component 10 is used as the surface assembling component 2.

First, the wiring substrate 3 is mounted on the mounting section 5 of the connection device 1. At this time, the wiring substrate 3 is mounted with the heat press head 7 being position-adjusted so as to be located right above the position at which the chip stacked component 10 is mounted.

Next, an insulating adhesive film 17 serving as an adhesive agent 6 is temporarily press-bonded onto the wiring substrate 3 mounted on the mounting section 5. The insulating adhesive film 17 is drawn from a reel 26, and after having been cut into a predetermined length, it is disposed at the position of the wiring substrate 3 where the chip stacked component 10 is mounted, and heated and pressed by the heat press head 7 at such a temperature, a pressure and a period of time so as to cause a binder 23 to exert flowability, but not to be thermally cured. Thereafter, the chip stacked component 10 is mounted by an automatic mounting device or the like at a predetermined position of the wiring substrate 3 with the insulating adhesive film 17 interposed therebetween.

Figure 4:
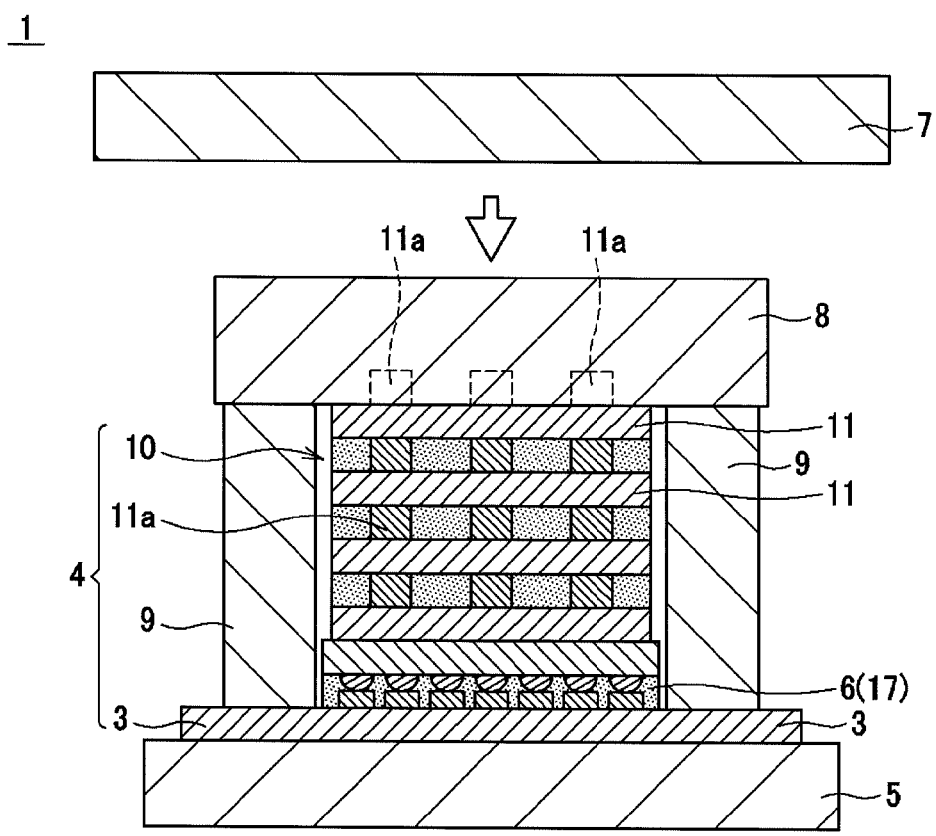
FIG. 4 is a cross-sectional view showing an assembling process of a surface assembling member according to one or more embodiments.

Next, as shown in FIG. 4, a second elastic body 9 serving as a support member is disposed in a manner so as to surround the chip stacked component 10, and a first elastic body 8 is disposed so as to cover the chip stacked component 10 and allow the second elastic body 9 to support the outer peripheral portion thereof, and with the first elastic body 8 interposed therebetween, the chip stacked component 10 is heated and pressed at a predetermined pressure for a predetermined period of time by the heat press head 7 heated to a predetermined temperature.

At this time, by heating and pressing the chip stacked component 10 with the first elastic body 8 having the aforementioned predetermined elastic modulus interposed therebetween, the connection device 1 makes it possible to prevent a pressure concentration onto bumps 11a formed on the chip substrate 11. Moreover, because the connection device 1 supports the outer peripheral portion of the first elastic body 8 by using the second elastic body 9 having a hardness higher than the hardness of the first elastic body 8, it is possible to prevent the pressure by the first elastic body 8 from concentrating on the outer peripheral portion of the chip stacked component 10. Therefore, the connection device 1 uniformly presses the upper surface of the chip stacked component 10 by the first elastic body 8 so that it is possible to prevent cracking of the chip substrates 11, and consequently to prevent the connection reliability between the chip substrates 11 and the connection reliability between the chip stacked component 10 and the wiring substrate 3 from deteriorating due to cracking.

With this arrangement, the electrodes of the chip stacked component 10 and the electrodes of the wiring substrate 3 are made in contact with each other, and because the binder 23 of the insulating adhesive film 17 is thermally cured in this state, a connection structure 4 in which the chip stacked component 10 is assembled on the wiring substrate 3 is produced.

Additionally, although the chip stacked component 10 is used as the surface assembling component 2 in one or more embodiments, package components, such as, for example, ICs, LSIs, or chip components, such as resistors, capacitors, may be assembled as the surface assembling component 2. Moreover, for the connection between the electrodes of the wiring substrate 3 and the electrodes of the surface assembling component 2, an anisotropic conductive film 18 or a paste-state adhesive agent 6 may be used.

[Production Process 2]

The following description will discuss a process for producing the chip stacked component 10 by using the connection device 1. First, as a pretreatment for the heating and pressing processes by the connection device 1, a chip stacked body 12 in which a plurality of chip substrates 11 are position-adjusted so as to make mutual bumps 11a in contact with each other and stacked with the insulating adhesive film 17 interposed therebetween is formed.

Next, the chip stacked body 12 is mounted on the mounting section 5 of the connection device 1. At this time, the chip stacked body 12 is position-adjusted and mounted so that the heat press head 7 is placed right thereon.

Figure 5:
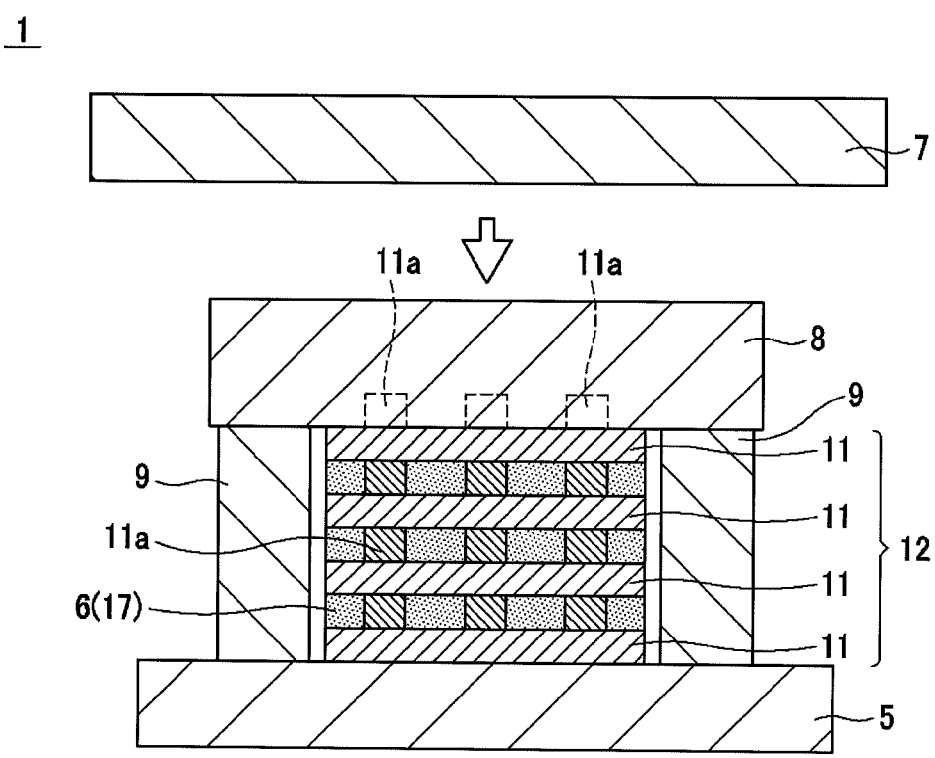
FIG. 5 is a cross-sectional view showing a manufacturing process of a chip stacked component according to one or more embodiments.

Next, as shown in FIG. 5, the second elastic body 9 serving as a support member is disposed in a manner so as to surround the periphery of the chip stacked body 12, and the first elastic body 8 is disposed so as to cover the chip stacked body 12 and allow the second elastic body 9 to support the peripheral portion thereof so that with the first elastic body 8 interposed therebetween, the chip stacked body 12 is heated and pressed at a predetermined pressure for a predetermined period of time by the heat press head 7 heated to a predetermined temperature.

At this time, by heating and pressing the chip stacked body 12 with the first elastic body 8 having the aforementioned predetermined elastic modulus interposed therebetween, the connection device 1 makes it possible to prevent a pressure concentration onto bumps 11a formed on the chip substrates 11. Moreover, because the connection device 1 supports the first elastic body 8 by using the second elastic body 9 having a hardness higher than the hardness of the first elastic body 8, it is possible to prevent the pressure by the first elastic body 8 from concentrating on the outer peripheral portion of the chip stacked body 12. Therefore, the connection device 1 uniformly presses the upper surface of the chip stacked body 12 by the first elastic body 8, so that it is possible to prevent cracking of the chip substrates 11, and to prevent the connection reliability between the chip substrates 11 of the chip stacked body 12 from deteriorating due to cracking of the chip substrates 11.

With this arrangement, in the respective chip substrates 11 forming the chip stacked body 12, because the binder 23 of the insulating adhesive film 17 is thermally cured, with the bumps 11a being mutually connected to each other, a chip stacked component 10 is produced.

Moreover, the production process of this chip stacked component 10 may be carried out on a semiconductor wafer or the wiring substrate 3. By carrying out the production process of the chip stacked component 10 on the wiring substrate 3, the production of the chip stacked component 10 and the assembling process of the chip stacked component 10 can be carried out simultaneously. In this case, the adhesive agent 6, such as the insulating adhesive film 17, the anisotropic conductive film 18 is prepared between the chip substrates 11 on the lowermost layer of the chip stacked body 12 and a predetermined position of the wiring substrate 3, and heating and pressing processes are carried out thereon in a batch process by the heat press head 7. Thus, the chip stacked body 12 is heated and pressed, so that the chip stacked component 10 in which the respective chip substrates 11 are connected to one another, with the interlayer connecting bumps 11a of the chip substrates 11 being connected to each other, is produced, and a connection structure 4 in which the chip stacked component 10 is assembled on the wiring substrate 3 is also produced.

[Other Embodiments]

Figure 6:
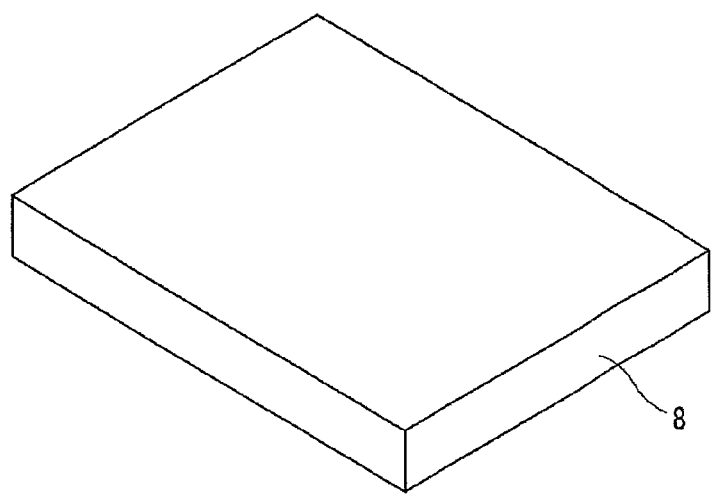
FIG. 6 is a perspective view showing another configuration of each of the first and second elastic bodies according to one or more embodiments.
Figure 6:
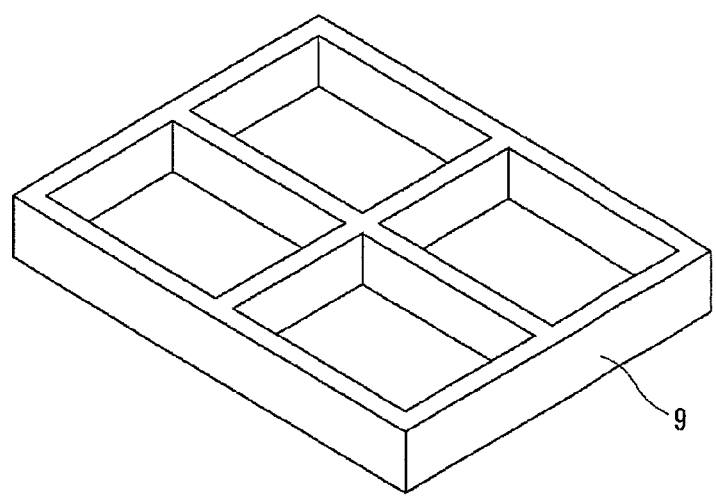
Figure 7:
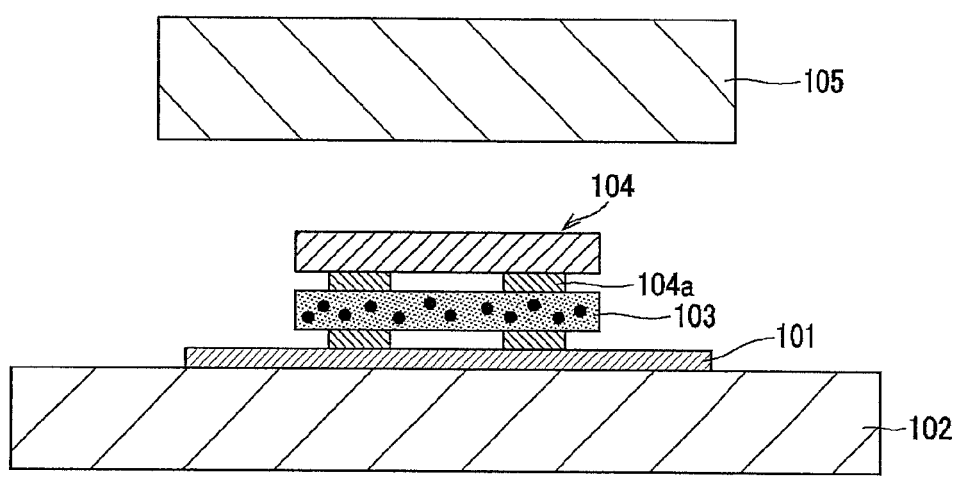
FIG. 7 is a side face view showing a conventional assembling device.
Figure 8A:
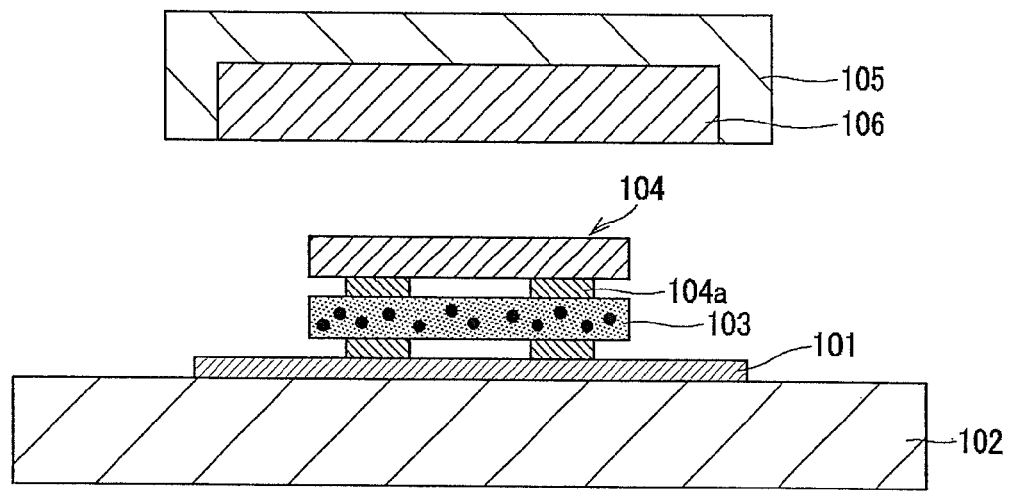
FIGS. 8A-8B depict cross-sectional views of an assembling device using a conventional buffer member.
Figure 8B:
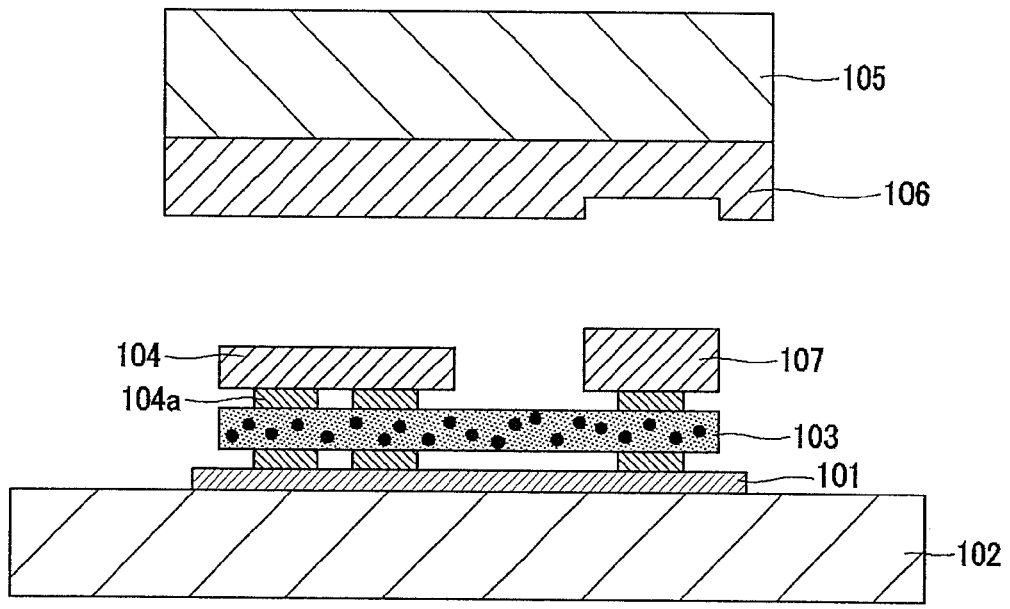
Figure 9:
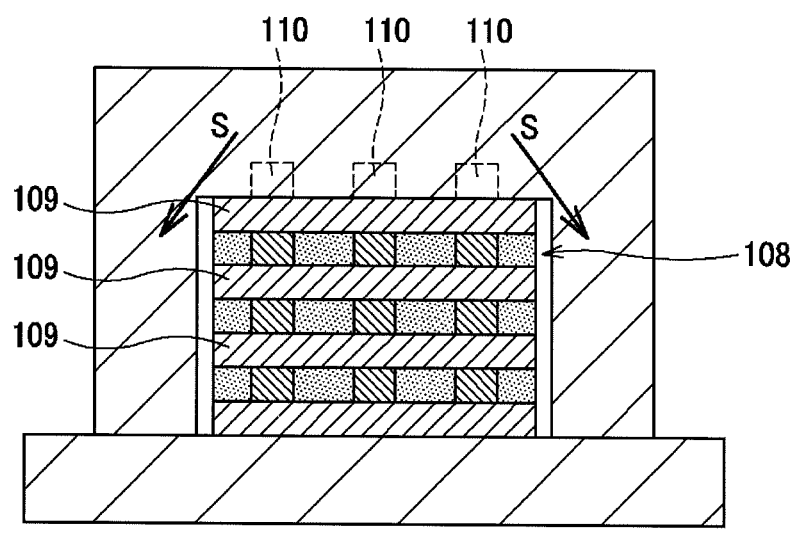
FIG. 9 is a cross-sectional view showing an assembling process of the chip stacked component according to one or more embodiments.

Moreover, as shown in FIG. 6, the connection device 1 may be designed to simultaneously heat and press a plurality of electronic components by forming the second elastic body 9 into a lattice shape in accordance with the numbers of the surface assembling components 2 and the chip stacked bodies 12. The surface assembling components 2 and the chip stacked bodies 12 are disposed in the divided regions of the second elastic body 9 formed into the lattice shape. The first elastic body 8 for pressing the surface assembling components 2 and the chip stacked bodies 12 from the upper surfaces thereof covers the respective lattices of the second elastic body 9 formed into the lattice shape, and the entire surface including the outer peripheral portion thereof is supported by the second elastic body 9 in a lattice shape. The lattice shape formed by the second elastic body 9 may have either a one line with a plurality of rows or a plurality of lines with a plurality of rows.

EXAMPLES

Next, explanations will be given to examples of one or more embodiments of the present invention. In examples, examples and comparative examples, in which the hardness of each of the elastic bodies 8 and 9 was changed, were prepared, and by using the first and second elastic bodies 8 and 9 relating each of the examples and comparative examples, the chip stacked body 12 in which the chip substrates 11 were stacked with the insulating adhesive film 17 interposed therebetween was heated and pressed by the connection device 1, so that each of the chip stacked components 10 was produced. After the production, the occurrence of cracking (cracks) of the chip stacked component 10 and the connection reliability between the chip substrates 11 were evaluated.

The presence or absence of the occurrence of cracking (cracks) was visually observed. The connection reliability was evaluated by comparing an initial conductive resistance of the chip stacked component 10 and a conductive resistance value after having been subjected to a PCT test (Pressure Cooker Test: 130° C., 85% RH, 300 hours) and a TCT test (Temperature Cycle Test: −55° C., 30 min ⇔ 125° C., 30 min, 500 cycles), and those having a rise in the conductive resistance value of 30% or more were defined as NG (x).

The first and second elastic bodies 8 and 9 relating to the respective examples and comparative examples were formed by using a silicone rubber. The insulating adhesive film 17 was formed by using an epoxy-based curing resin. The chip stacked component 10 was formed by stacking four layers of chip substrates 11 having a thickness of 50 µm. On each of the chip substrates 11, interlayer connecting bumps were formed in 25 pieces×2 rows (pitch width: 40 µm).

The heating and pressing conditions of the chip stacked body 12 by the heat press head 7 were 230° C., 10 N and 30 sec. The rubber hardness of each of the first and second elastic bodies 8 and 9 relating to the examples and comparative examples was a measured value by a type-A durometer specified by JIS K 6253.

In example 1, relative to the rubber hardness of the first elastic body 8 of 20, the rubber hardness of the second elastic body 9 was set to 20.

In example 2, relative to the rubber hardness of the first elastic body 8 of 20, the rubber hardness of the second elastic body 9 was set to 40.

In example 3, relative to the rubber hardness of the first elastic body 8 of 20, the rubber hardness of the second elastic body 9 was set to 60.

In example 4, relative to the rubber hardness of the first elastic body 8 of 20, the rubber hardness of the second elastic body 9 was set to 80.

In comparative example 1, relative to the rubber hardness of the first elastic body 8 of 40, the rubber hardness of the second elastic body 9 was set to 20.

In example 5, relative to the rubber hardness of the first elastic body 8 of 40, the rubber hardness of the second elastic body 9 was set to 40.

In example 6, relative to the rubber hardness of the first elastic body 8 of 40, the rubber hardness of the second elastic body 9 was set to 60.

In example 7, relative to the rubber hardness of the first elastic body 8 of 40, the rubber hardness of the second elastic body 9 was set to 80.

In comparative example 2, relative to the rubber hardness of the first elastic body 8 of 60, the rubber hardness of the second elastic body 9 was set to 20.

In comparative example 3, relative to the rubber hardness of the first elastic body 8 of 60, the rubber hardness of the second elastic body 9 was set to 40.

In example 8, relative to the rubber hardness of the first elastic body 8 of 60, the rubber hardness of the second elastic body 9 was set to 60.

In example 9, relative to the rubber hardness of the first elastic body 8 of 60, the rubber hardness of the second elastic body 9 was set to 80.

In comparative example 4, relative to the rubber hardness of the first elastic body 8 of 80, the rubber hardness of the second elastic body 9 was set to 20.

In comparative example 5, relative to the rubber hardness of the first elastic body 8 of 80, the rubber hardness of the second elastic body 9 was set to 40.

In comparative example 6, relative to the rubber hardness of the first elastic body 8 of 80, the rubber hardness of the second elastic body 9 was set to 60.

In comparative example 7, relative to the rubber hardness of the first elastic body 8 of 80, the rubber hardness of the second elastic body 9 was set to 80.

In contrast, in comparative examples 1 to 3, because any hardness of the second elastic body 9 was lower than the hardness of the first elastic body 8, it was not possible to prevent the pressure concentration onto the peripheral portion of the chip stacked body 12 due to the first elastic body 8 by using the second elastic body 9, with the result that cracking occurred. Moreover, the increasing rate of the conductive resistance value after the PCT test and TCT test was 30% or more. For this reason, these conditions were insufficient in producing the chip stacked component 10 in which ultra-thin chip substrates 11 having a thickness of 50 μm were stacked.

Moreover, in comparative examples 4 to 7, because the hardness of the first elastic body 8 was as high as 80, it was not possible to disperse the pressure concentration onto the bumps 11a by the first elastic body 8, with the result that cracking occurred due to the pressure concentration onto the bumps 11a. Furthermore, the increasing rate of the conductive resistance value after the PCT test and the TCT test

TABLE 1

| | Rubber hardness of first elastic body | Rubber hardness of second elastic body | Cracking | Reliability test | Evaluation |
|---|---|---|---|---|---|
| Example 1 | 20 | 20 | ○ | ○<br>0.12 Ω → 0.15 Ω | ○ |
| Example 2 | | 40 | ○ | ○<br>0.12 Ω → 0.15 Ω | ○ |
| Example 3 | | 60 | ○ | ○<br>0.12 Ω → 0.14 Ω | ○ |
| Example 4 | | 80 | ○ | ○<br>0.12 Ω → 0.14 Ω | ○ |
| Comparative Example 1 | 40 | 20 | x | x<br>0.12 Ω → 0.18 Ω | x |
| Example 5 | | 40 | ○ | ○<br>0.12 Ω → 0.15 Ω | ○ |
| Example 6 | | 60 | ○ | ○<br>0.12 Ω → 0.13 Ω | ○ |
| Example 7 | | 80 | ○ | ○<br>0.12 Ω → 0.13 Ω | ○ |
| Comparative Example 2 | 60 | 20 | x | x<br>0.12 Ω → 0.19 Ω | x |
| Comparative Example 3 | | 40 | x | x<br>0.12 Ω → 0.16 Ω | x |
| Example 8 | | 60 | ○ | ○<br>0.12 Ω → 0.15 Ω | ○ |
| Example 9 | | 80 | ○ | ○<br>0.12 Ω → 0.14 Ω | ○ |
| Comparative Example 4 | 80 | 20 | x | x<br>0.12 Ω → 0.19 Ω | x |
| Comparative Example 5 | | 40 | x | x<br>0.12 Ω → 0.17 Ω | x |
| Comparative Example 6 | | 60 | x | x<br>0.12 Ω → 0.18 Ω | x |
| Comparative Example 7 | | 80 | x | x<br>0.12 Ω → 0.19 Ω | x |

The results of measurements are shown in Table 1. As shown in Table 1, because the hardness of the second elastic body 9 in any of examples 1 to 9 was more than a hardness of the first elastic body 8, the pressure concentrating on the bumps 11a could be dispersed by supporting the first elastic body 8 by using the second elastic body 9, and the pressure concentration onto the outer peripheral portion of the chip stacked body 12 by the first elastic body 8 could also be prevented so that even in the case of producing the chip stacked component 10 in which ultra-thin chip substrates 11 having a thickness of 50 μm were stacked, it was possible to prevent cracking. Moreover, the increasing rate of the conductive resistance value was kept at less than 30% even after the PCT test and TCT test, and the interlayer connection of the respective chip substrates 11 was good.

became 30% or more. For this reason, these conditions were insufficient in producing the chip stacked component 10 in which ultra-thin chip substrates 11 having a thickness of 50 μm were stacked.

REFERENCE SIGNS LIST

1 . . . connection device, 2 . . . surface packaging component, 3 . . . wiring substrate, 4 . . . connection structure, 5 . . . mounting section, 6 . . . adhesive agent, 7 . . . heat press head, 8 . . . first elastic body, 9 . . . second elastic body, 10 . . . chip stacked component, 11 . . . chip substrate, 12 . . . chip stacked body, 17 . . . insulating adhesive film, 18 . . . anisotropic conductive film, 23 . . . binder, 24 . . . conductive particles, 25 . . . separation film, 26 . . . reel.

Although the disclosure has been described with respect to a limited number of embodiments, those skilled in the art, having the benefit of this disclosure, will appreciate that various other embodiments may be devised without departing from the scope of the present invention. Accordingly, the scope of the invention should be limited only by the attached claims.

The invention claimed is:

1. A method for manufacturing a chip stacked component in which a plurality of chip substrates are stacked, each of the plurality of chip substrates is connected to one another electrically and mechanically, the method comprising:
   mounting bumps formed on one surface of each chip substrate on an electrode formed on another surface of an adjacent chip substrate with a thermosetting adhesive agent interposed therebetween such that a chip stacked body on which a plurality of chip substrates are stacked is formed; and
   disposing a first elastic body on an upper surface side of the chip stacked body, disposing a support member for supporting the first elastic body on a periphery of the chip stacked body, and heating and pressing the chip stacked body by using a heat press head with the first elastic body being interposed therebetween.

2. The method according to claim 1, wherein the support member is a second elastic body having a hardness greater than a hardness of the first elastic body.

3. The method according to claim 2, wherein each of the first elastic body and the second elastic body has a hardness that is between 20 and 60 when measured by a type-A durometer specified by JIS K 6253.

4. The method according to claim 3, wherein the chip stacked body comprises at least one layer of a chip substrate having a thickness of 100 μm or less.

5. The method according to claim 1, wherein a region on which the electronic component is mounted is divided into a plurality of regions by the support member such that a plurality of chip stacked components are simultaneously assembled thereon.

6. The method according to claim 1, wherein the chip stacked body is mounted on a substrate or a wafer with a thermosetting adhesive agent being interposed therebetween and wherein the heating and pressing processes are carried out in a batch process.

* * * * *